US009421576B2

(12) United States Patent
Kim et al.

(10) Patent No.: US 9,421,576 B2
(45) Date of Patent: Aug. 23, 2016

(54) VIBRATION GENERATING APPARATUS AND ELECTRONIC APPARATUS INCLUDING THE SAME

(71) Applicant: SAMSUNG ELECTRO-MECHANICS CO., LTD., Suwon-Si (KR)

(72) Inventors: Jae Kyung Kim, Suwon-si (KR); Dong Su Moon, Suwon-si (KR); Sang Jin Lee, Suwon-Si (KR)

(73) Assignee: MPLUS CO., LTD., Suwon-Si, Gyeonggi-Do (KR)

( * ) Notice: Subject to any disclaimer, the term of this patent is extended or adjusted under 35 U.S.C. 154(b) by 9 days.

(21) Appl. No.: 14/601,241

(22) Filed: Jan. 21, 2015

(65) Prior Publication Data

US 2015/0333699 A1 Nov. 19, 2015

(30) Foreign Application Priority Data

May 14, 2014 (KR) ........................ 10-2014-0057611

(51) Int. Cl.

| G06F 3/042 | (2006.01) |
| B06B 1/14 | (2006.01) |
| H03B 5/32 | (2006.01) |
| B06B 1/06 | (2006.01) |
| H05K 5/00 | (2006.01) |

(Continued)

(52) U.S. Cl.
CPC ............... *B06B 1/14* (2013.01); *B06B 1/0215* (2013.01); *B06B 1/0603* (2013.01); *G06F 1/16* (2013.01); *G06F 3/01* (2013.01); *G06F 3/016* (2013.01); *G06F 3/041* (2013.01); *G06F 3/0412* (2013.01); *H03B 5/32* (2013.01); *H04M 1/026* (2013.01); *H05K 5/0017* (2013.01); *B06B 2201/55* (2013.01)

(58) Field of Classification Search
CPC .... G06F 1/1615; G06F 1/1684; G06F 3/016; G06F 3/0412; G06F 3/0416; G06F 2203/014; G08B 6/00; B06B 1/0603; B06B 1/0622; B06B 1/0644; B06B 1/0681; B06B 1/0685; B06B 1/12; H01L 41/04; H01L 41/053; H01L 41/0933; H03B 5/32; H05K 5/0017
See application file for complete search history.

(56) References Cited

U.S. PATENT DOCUMENTS 5,229,744 A * 7/1993 Ogura .................. B06B 1/0603
310/324
5,780,958 A * 7/1998 Strugach ................ G10K 9/122
310/330

(Continued)

FOREIGN PATENT DOCUMENTS

| JP | 11-089254 A | 3/1999 |
| KR | 10-2011-0045486 A | 5/2011 |
| KR | 10-1354856 B1 | 1/2014 |

*Primary Examiner* — Joe H Cheng
(74) *Attorney, Agent, or Firm* — LRK Patent Law Firm

(57) ABSTRACT

There are provided a vibration generating apparatus and an electronic apparatus including the same. The vibration generating apparatus includes: a housing having an internal space; an elastic member having both ends fixed to the housing so as to be elastically deformably disposed in the internal space; and a piezoelectric element mounted on one surface of the elastic member, wherein power is supplied to the piezoelectric element so that warpage of the piezoelectric element is only generated toward any one of one surface of the elastic member and the other surface of the elastic member, a surface opposite to the one surface of the elastic member.

10 Claims, 5 Drawing Sheets

(51) Int. Cl.
  *G06F 3/041* (2006.01)
  *G06F 1/16* (2006.01)
  *G06F 3/01* (2006.01)
  *B06B 1/02* (2006.01)
  *H04M 1/02* (2006.01)

(56) References Cited

U.S. PATENT DOCUMENTS

| | | | |
|---|---|---|---|
| 2004/0227721 A1* | 11/2004 | Moilanen | G06F 1/1626 345/107 |
| 2006/0181522 A1* | 8/2006 | Nishimura | G06F 3/016 345/177 |
| 2007/0080951 A1* | 4/2007 | Maruyama | G06F 1/1626 345/173 |
| 2011/0127884 A1* | 6/2011 | Woo | B06B 1/0622 310/328 |
| 2011/0260995 A1* | 10/2011 | Woo | G06F 3/016 345/173 |
| 2012/0153775 A1* | 6/2012 | Park | G06F 3/016 310/326 |
| 2012/0212100 A1 | 8/2012 | Lee | |
| 2012/0242593 A1* | 9/2012 | Kim | G06F 3/016 345/173 |
| 2013/0002093 A1* | 1/2013 | Kim | G06F 3/016 310/324 |
| 2013/0093577 A1* | 4/2013 | Park | G06F 3/0416 340/407.1 |
| 2013/0300261 A1* | 11/2013 | Kim | B06B 1/0603 310/348 |
| 2014/0346924 A1* | 11/2014 | Son | B06B 1/0603 310/317 |
| 2014/0346926 A1* | 11/2014 | Choi | H02N 2/006 310/323.01 |
| 2015/0054779 A1* | 2/2015 | Horii | H04M 1/026 345/174 |
| 2015/0163598 A1* | 6/2015 | Abe | H04R 17/00 381/114 |
| 2015/0214463 A1* | 7/2015 | Moon | H01L 41/0533 310/345 |

* cited by examiner

VIBRATION GENERATING APPARATUS AND ELECTRONIC APPARATUS INCLUDING THE SAME

CROSS-REFERENCE TO RELATED APPLICATION

This application claims the priority and benefit of Korean Patent Application No. 10-2014-0057611 filed on May 14, 2014, with the Korean Intellectual Property Office, the disclosure of which is incorporated in its entirety herein by reference.

BACKGROUND

The present disclosure relates to a vibration generating apparatus and an electronic apparatus including the same.

A vibration generating apparatus converts electrical energy into mechanical vibrations using the principle of the generation of electromagnetic force.

The vibration generating apparatus may use a piezo haptic actuator using a piezoelectric element as a driving source. In such a piezo haptic actuator, using the principle of an inverse piezoelectric effect in which displacement is generated when a voltage is applied to the piezoelectric element, a weight body of a mover moves by the generated displacement to generate vibration force.

Recently, in accordance with the trend for the miniaturization of electronic products, a decrease in a size of a vibration generating apparatus module has been demanded. In addition, a piezo haptic actuator capable of implementing the same level of performance over a long period of time, in order to improve durability, has been demanded.

SUMMARY

An aspect of the present disclosure may provide a piezo haptic actuator capable of significantly decreasing a size of a vibration generating apparatus module and having improved durability.

According to an aspect of the present disclosure, a vibration generating apparatus may include: a housing having an internal space; an elastic member having both ends fixed to the housing so as to be elastically deformably disposed in the internal space; and a piezoelectric element mounted on one surface of the elastic member, wherein power is supplied to the piezoelectric element so that warpage of the piezoelectric element is only generated toward any one of one surface of the elastic member and the other surface of the elastic member, a surface opposite to the one surface of the elastic member.

That is, in the present disclosure, only a voltage having a value corresponding to that of an electrical field of the piezoelectric element may be input to the piezoelectric element to allow vibrations to be mainly generated in one direction in the elastic member.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Exemplary embodiments of the present disclosure will now be described in detail with reference to the accompanying drawings.

In a vibration generating apparatus 100 according to an exemplary embodiment of the present disclosure allowing only a one-direction deformation voltage deforming a piezoelectric element in only one direction to be input to the piezoelectric element provided on an elastic member, a size of a vibration generating apparatus module may be significantly decreased, and durability of an actuator may be improved.

Figure 1:
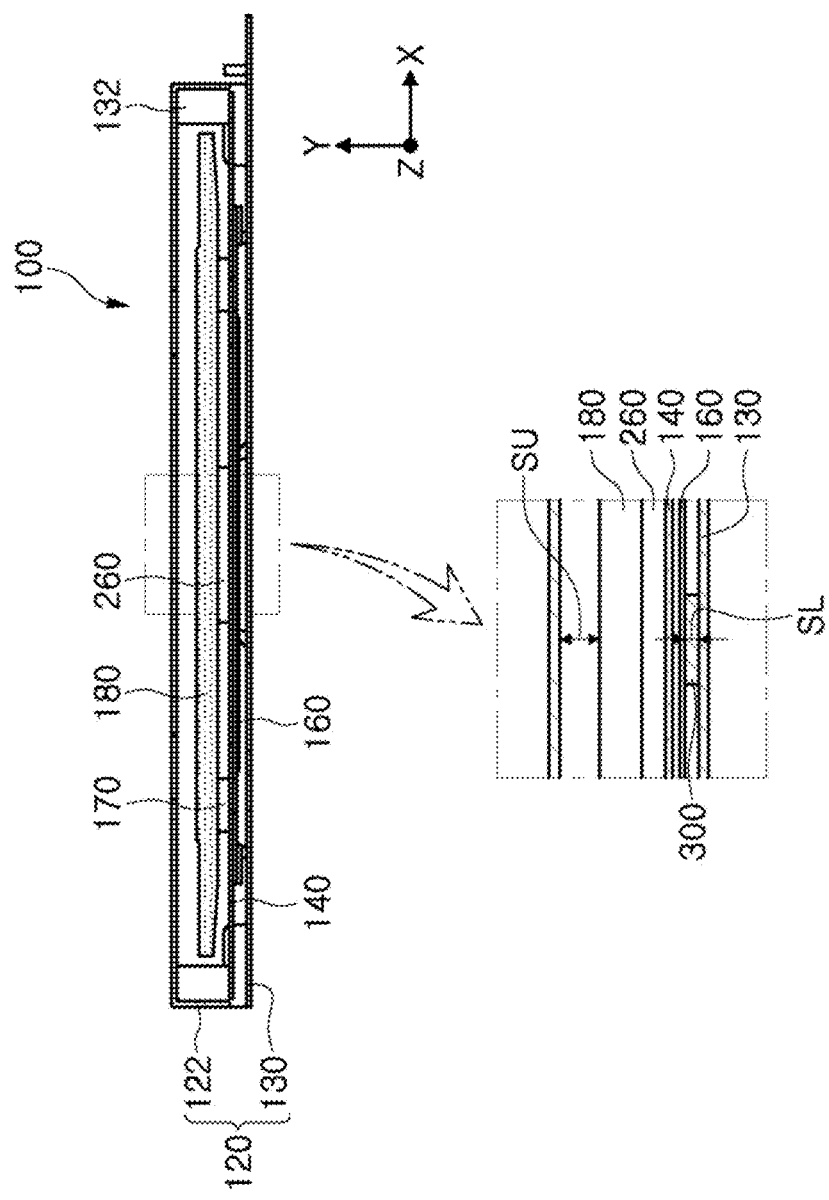
FIG. 1 is a cross-sectional view of a vibration generating apparatus according to an exemplary embodiment of the present disclosure.
Figure 2:
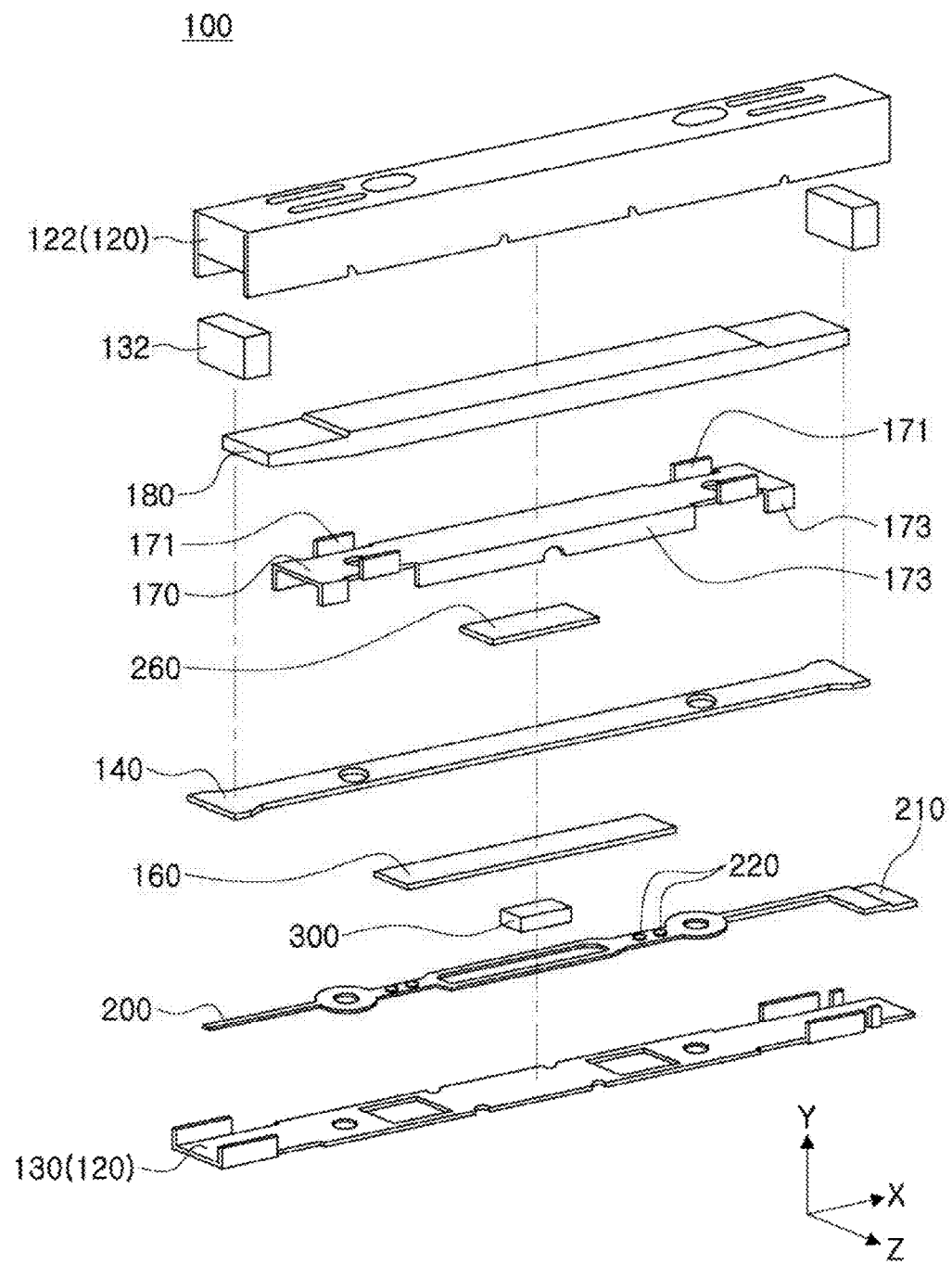
FIG. 2 is an exploded perspective view of the vibration generating apparatus according to an exemplary embodiment of the present disclosure.

FIG. 1 is a cross-sectional view of a vibration generating apparatus according to an exemplary embodiment of the present disclosure; and FIG. 2 is an exploded perspective view of the vibration generating apparatus according to an exemplary embodiment of the present disclosure.

Referring to FIGS. 1 and 2, a vibration generating apparatus 100 may include a housing 120 including an upper case 122 and a lower case 130, an elastic member 140, a piezoelectric element 160, a weight body 180, and a circuit board 200.

In addition, the vibration generating apparatus 100 may further include a stopper or a damper 300 disposed in a vibration space SL positioned in a direction opposite to a direction in which the elastic member 140 is deformed by power supplied to the piezoelectric element 160.

Here, terms with respect to directions will be defined. As viewed in FIGS. 1 and 2, an X direction refers to a length direction, and a Z direction, that is, a direction perpendicular to both of the X direction and a Y direction, refers to a width direction. In addition, the Y direction refers to a height direction. In addition, the terms defined above will be used below as the same meaning as the defined meaning. That is, the above-mentioned terms indicate the same directions with respect to the respective components.

Hereinafter, the vibration generating apparatus 100 according to an exemplary embodiment of the present disclosure will be described in detail with reference to the accompanying drawings. However, an exemplary embodiment of the present disclosure is not limited to contents to be described below, but may be variously modified without departing from the spirit and scope of the present disclosure.

The housing 120 may include the upper case 122 and the lower case 130. In addition, the upper case 122 may have a box shape having an internal shape. The lower case 130 may have a plate shape.

In addition, the upper case 122 and the lower case 130 may be firmly coupled to each other by a welding method, a bonding method using an adhesive, or the like.

In addition, the upper case 122 or the lower case 130 may have support members 132 each formed at both end portions thereof in order to support both end portions of the elastic member 140.

The support members 132 may be formed by denting the upper case 122 or the lower case 130 or be formed by attaching separate members to the upper case 122 or the lower case 130. However, this is only an example, and is not limited thereto.

The elastic member 140 may be formed in a plate shape, and both end portions of the elastic member 140 in the length direction may be disposed, respectively, on the support members 132 provided on the upper case 130 or the lower case 122.

Both end portions of the elastic member 140 may be firmly fixed to the support member 132, respectively, by a welding method or a bonding method by an adhesive.

The elastic member 140 having the plate shape may have the piezoelectric element 160 disposed on an upper surface or a lower surface thereof in the height direction. The piezoelectric element 160 may be fixed to the elastic member 140 by a bonding method using an adhesive, or the like.

The piezoelectric element 160 may be fixed to the elastic member 140, as described above, and may have a rectangular parallelepiped shape. In addition, the piezoelectric element 160 may have electrodes disposed on a lower surface thereof. The electrodes may protrude from the lower surface of the piezoelectric element 160 and include a positive (+) electrode and a negative (−) electrode.

In addition, the piezoelectric element 160 may be connected to the circuit board 200 in order to supply power. The circuit board 200 may include an external terminal 210 exposed to the outside of the housing 120 so as to be connected to an external power supply. In addition, the circuit board 200 may include an internal terminal 220 contacting the piezoelectric element 160 so as to supply the power to the piezoelectric element 160.

Meanwhile, the power may be supplied to the piezoelectric element 160 so that warpage of the piezoelectric element 160 is only generated toward any one of one surface of the elastic member 140 and the other surface of the elastic member 140, a surface opposite to the one surface of the elastic member 140. That is, the power may be supplied so that the elastic member 140 is deformed in only one direction by warpage force of the piezoelectric element 160.

Therefore, only a voltage having a value corresponding to that of an electric field of the piezoelectric element 160 may be input to the piezoelectric element 160.

Figure 4:
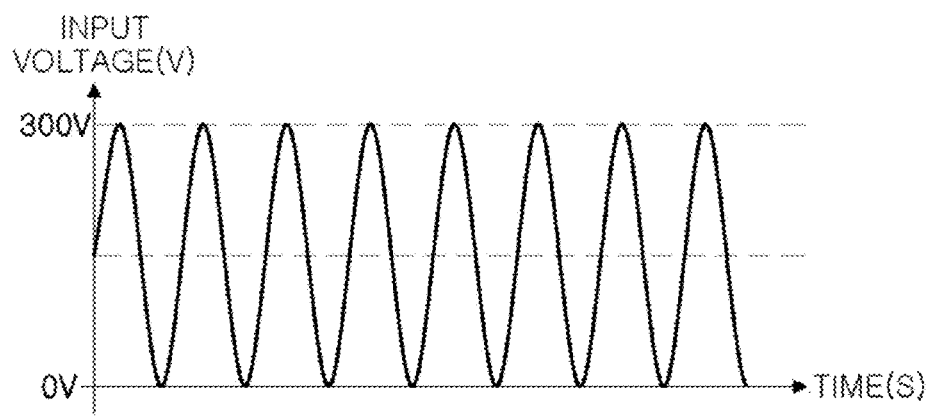
FIG. 4 is a graph showing an example of a voltage input to a piezoelectric element according to an exemplary embodiment of the present disclosure.

In other words, in the case in which the electric field is present in a positive (+) direction in the piezoelectric element 160, only a positive (+) voltage may be supplied to the piezoelectric element 160, and in the case in which the electric field is present in a negative (−) direction in the piezoelectric element 160, only a negative (−) voltage may be supplied to the piezoelectric element 160 (See FIG. 4 showing an example in which a voltage is supplied in the case in which the electric field is present in the positive (+) direction in the piezoelectric element).

A coercive electric field may mean strength of an electric field at a place at which a dielectric flux density on a main hysteresis curve of a ferroelectric substance continuously and repeatedly becomes zero. That is, the coercive electric field may mean a voltage at which polarities of the respective particles provided in the piezoelectric element are changed (or disappear).

However, since the coercive electric field is present in only a direction opposite to a direction in which an electric field is first input to the piezoelectric element, a positive (+) electric field having a very large value may be input to the piezoelectric element having the electric field in the positive (+) direction; however, polarities of the particles may be changed (disappear) when the negative (−) electric field is input by a magnitude of a coercive electric field value to the piezoelectric element having the electric field in the positive (+) direction, and vice versa.

Figure 3:
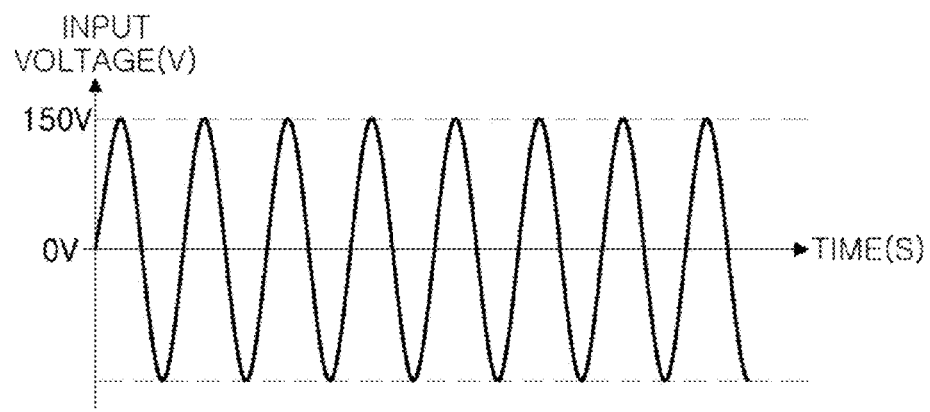
FIG. 3 is a graph showing an example of a voltage input to a piezoelectric element according to the related art.

Therefore, even though a voltage is periodically applied to the piezoelectric element in a situation in which a maximum displacement value thereof is 100 V, there may be a difference between the case in which a voltage of 0 to 100 V is input (See FIG. 4) and the case in which a voltage of −50 V to +50 V is input (See FIG. 3).

The piezoelectric element having the electric field in the positive (+) direction is subjected to performance deterioration at the time of being used for a long period of time due to a repetitive input of −50 V even through the coercive electric field value exceeds 50 V.

Therefore, in an exemplary embodiment of the present disclosure, in the case in which the electric field is present in the positive (+) direction in the piezoelectric element 160, only the positive (+) voltage may be supplied to the piezoelectric element 160, and in the case in which the electric field is present in the negative (−) direction in the piezoelectric element 160, only the negative (−) voltage may be supplied to the piezoelectric element 160 (See FIG. 4 showing the example in which the voltage is supplied in the case in which the electric field is present in the positive (+) direction in the piezoelectric element), such that the piezoelectric element 160 may not be subjected to the performance deterioration in spite of being repetitively used for a long period of time.

The weight body 180 may be provided so as to vibrate together with the elastic member 140. The weight body 180 may apply a weight to the elastic member 140 to adjust a frequency.

The weight body 180 may be bonded to one surface of the elastic member 140 through an adhesive or an adhering tape 260. Here, the adhesive or the adhering tape 260 may have buffering force so as to prevent damage to the elastic member 140.

In the case in which an entire front surface of the weight body 180 in the length direction is coupled to the elastic member 140, it may hinder warpage of the elastic member 140. Therefore, the adhesive or the adhering tape 260 may be interposed in a central portion, in the length direction, of the elastic member 140 in which the largest warpage is generated.

In addition, in the case in which the weight body 180 is provided in the same direction as a direction in which the piezoelectric element 160 is coupled based on the elastic member 140, the weight body 180 may be bonded to the piezoelectric element 160 through the adhesive or the adhering tape 260.

However, the present disclosure is not limited thereto. That is, the weight body 180 may be fixed to coupling members or a guide members protruding from both side surfaces of the elastic member 140 in the width direction in the height direction.

Meanwhile, the weight body 180 may be provided with a weight body cover 170. The weight body cover 170 may have a plate shape.

In addition, the weight body cover 170 may have support protrusions 171 protruding from both side surfaces thereof in the width direction in the height direction so as to be easily coupled to the weight body 180, thereby allowing the weight body 180 to be firmly coupled between the support protrusions 171.

Further, the weight body cover 170 may have guide protrusions 173 protruding from both side surfaces thereof in the width direction in the height direction so that the weight body 180 may easily move in the height direction.

The guide protrusions 173 may have a length in the height direction enough to enclose side surfaces of the elastic member 140 in the case in which the weight body 180 vibrates in the height direction.

In the vibration generating apparatus 100 according to an exemplary embodiment of the present disclosure, the power may be supplied to the piezoelectric element 160 so that the warpage of the piezoelectric element 160 is only generated toward any one of one surface of the elastic member 140 and the other surface of the elastic member 140, a surface opposite to the one surface of the elastic member 140.

That is, the power may be supplied so that the elastic member 140 is deformed in only one direction by the warpage force of the piezoelectric element 160. Therefore, in the case in which the elastic member 140 vibrates, a vibration space may be secured in only any one of upward and downward height directions.

Therefore, in the vibration generating apparatus 100 according to an exemplary embodiment of the present disclosure, a width SU of an upper vibration space in a direction in which the warpage of the piezoelectric element 160 is generated by the supply of the power may be wider than a width SL of a lower vibration space in a direction opposite to the above-mentioned direction (See an enlarged view of FIG. 1).

Further, the vibration space in the direction opposite to the direction in which the warpage of the piezoelectric element 160 is generated by the supply of the power may be provided with a damper or a stopper 300 absorbing or limiting vibrations of the elastic member 140.

Although the voltage supplied to the piezoelectric element 160 provides only warpage force in one direction, deformation of the elastic member 140 may be generated also in a direction opposite to one direction by elastic restoring force or inertial force of the elastic member 140. Therefore, the vibration space in the direction opposite to the direction in which the warpage of the piezoelectric element 160 is generated may be provided with the damper or the stopper 300 absorbing or limiting the vibrations of the elastic member 140.

Here, the damper or the stopper 300 may be provided on a lower surface of the elastic member 140 or the housing 120, more specifically, an upper surface of the lower case 130.

Figure 5:
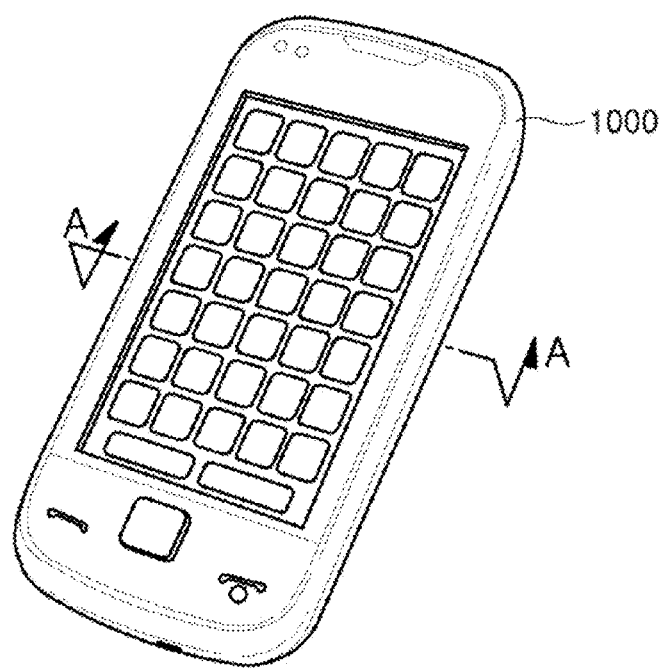
FIG. 5 is a perspective view of an electronic apparatus according to an exemplary embodiment of the present disclosure.

FIG. 5 is a cross-sectional view showing a form in which the vibration generating apparatus according to an exemplary embodiment of the present disclosure is driven.

In the vibration generating apparatus 100 according to an exemplary embodiment of the present disclosure, the elastic member 140 may generally allow the warpage to be generally generated in only one of the upward and downward height directions or allow the warpage not to be generated in the direction opposite to one direction.

Since the deformation of the elastic member 140 may be generated also in a direction opposite to one direction by the elastic restoring force or the inertial force of the elastic member 140 (the inertial force may be further increased by the weight body 180), the vibration space in the direction opposite to the direction in which the warpage of the piezoelectric element 160 is generated may be provided with the damper or the stopper 300 absorbing or limiting the vibrations of the elastic member 140.

Even in the case in which the damper or the stopper 300 is provided, the deformation of the elastic member 140 may be generated in the other direction even though an amount of deformation is small.

Figure 6:
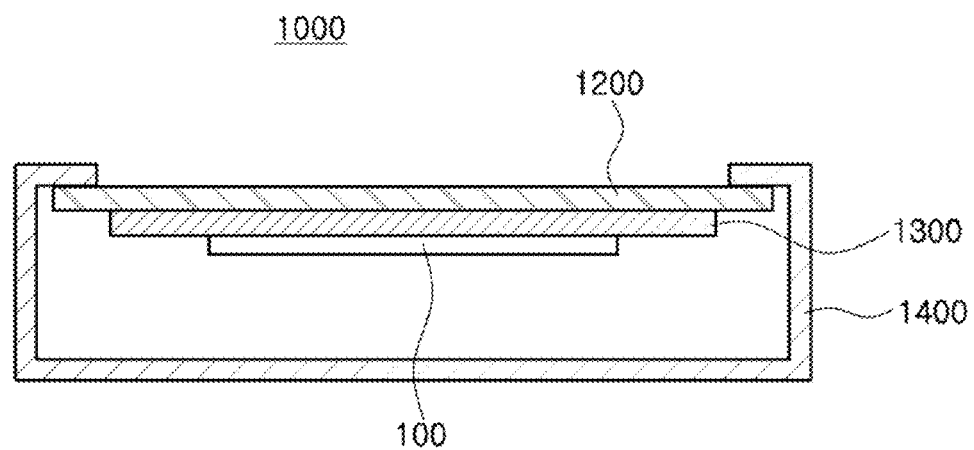
FIG. 6 is a cross-sectional view of the electronic apparatus according to an exemplary embodiment of the present disclosure.

FIG. 5 is a perspective view of an electronic apparatus according to an exemplary embodiment of the present disclosure; FIG. 6 is a cross-sectional view of the electronic apparatus according to an exemplary embodiment of the present disclosure; and FIG. 7 is a cross-sectional view of an electronic apparatus according to another exemplary embodiment of the present disclosure.

Figure 7:
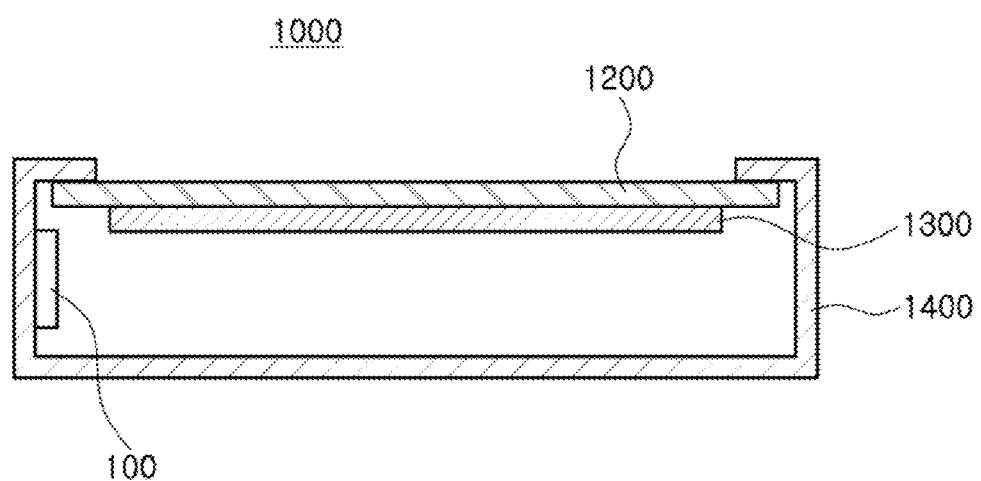
FIG. 7 is a cross-sectional view of an electronic apparatus according to another exemplary embodiment of the present disclosure.

As shown in FIGS. 5 through 7, an electronic apparatus 1000 according to the present disclosure may display an image depending on a selection of a user.

Referring to FIG. 5, an electronic apparatus 1000 according to an exemplary embodiment of the present disclosure may include a display module displaying the image depending on the selection of the user and a case 1400 having an internal space accommodating the display module therein.

The display module may include a touch panel 1200 providing touch pressure of the user and a display panel 1300 mounted on a lower surface of the touch panel 1200 and providing the image depending on the selection of the user, and the vibration generating apparatus 100 according to the present disclosure may be mounted on a lower surface of the display panel 1300 to provide vibrations depending on the selection of the user (See FIG. 6).

In addition, as shown in FIG. 7, the vibration generating apparatus 100 according to the present disclosure may be mounted on an inner surface of the case 1400 to directly provide vibrations to the display module.

As set forth above, according to exemplary embodiments of the present disclosure, a piezo haptic actuator capable of significantly decreasing a size of a vibration generating apparatus module and having improved durability may be provided.

While exemplary embodiments have been shown and described above, it will be apparent to those skilled in the art that modifications and variations could be made without departing from the scope of the present invention as defined by the appended claims.

What is claimed is:

1. A vibration generating apparatus comprising:
a housing having an internal space;
an elastic member having both ends fixed to the housing so as to be elastically deformably disposed in the internal space; and
a piezoelectric element mounted on one surface of the elastic member,
wherein power is supplied to the piezoelectric element so that warpage of the piezoelectric element is only generated toward any one of one surface of the elastic member and the other surface of the elastic member, a surface opposite to the one surface of the elastic member, and
wherein only a voltage having a same polarity as that of an electric field of the piezoelectric element is input to the piezoelectric element.

2. The vibration generating apparatus of claim 1, wherein a width of a vibration space in a direction in which the warpage of the piezoelectric element is generated by the supply of the power is wider than a width of a vibration space in a direction opposite to the direction in which the warpage of the piezoelectric element is generated.

3. The vibration generating apparatus of claim 1, further comprising a damper or a stopper absorbing or limiting vibrations of the elastic member, the damper or the stopper being provided in a vibration space in a direction opposite to a direction in which the warpage of the piezoelectric element is generated by the supply of the power.

4. The vibration generating apparatus of claim 3, wherein the damper is formed of rubber or silicon.

5. The vibration generating apparatus of claim 1, further comprising a weight body vibrating together with the elastic member.

6. A vibration generating apparatus comprising:
   a housing having an internal space;
   an elastic member having both ends fixed to the housing so as to be elastically deformably disposed in the internal space; and
   a piezoelectric element mounted on one surface of the elastic member,
   wherein only a voltage having a same polarity as that of an electric field of the piezoelectric element is input to the piezoelectric element.

7. An electronic apparatus comprising:
   a display module displaying an image depending on a selection of a user;
   a case having an internal space accommodating the display module therein; and
   a vibration generating apparatus mounted in the case and including a housing having an internal space, an elastic member mounted in the internal space, a piezoelectric element mounted on one surface of the elastic member and deformed to vibrate the elastic member,
   wherein only a voltage having a same polarity as that of an electric field of the piezoelectric element is input to the piezoelectric element.

8. The electronic apparatus of claim 7, wherein the vibration generating apparatus is mounted on an inner surface of the case.

9. The electronic apparatus of claim 7, wherein the vibration generating apparatus is mounted on a lower surface of the display module.

10. The electronic apparatus of claim 7, wherein the display module includes:
   a touch panel receiving a touch from the user; and
   a display panel contacting a lower surface of the touch panel and providing a corresponding image depending on a touch made to the touch panel.

* * * * *